(12) United States Patent
Kwon et al.

(10) Patent No.: US 7,132,747 B2
(45) Date of Patent: Nov. 7, 2006

(54) MULTILAYER INTEGRATED CIRCUIT FOR RF COMMUNICATION AND METHOD FOR ASSEMBLY THEREOF

(76) Inventors: Youngwoo Kwon, c/o Wavics Co. Ltd., 5F Emerald Bldg., 1364-20 Seocho-dong, Seocho-gu, Seoul (KR); Ki Woong Chung, c/o Wavics Co. Ltd., 5F Emerald Bldg., 1364-20 Seocho-dong, Seocho-gu, Seoul (KR)

( * ) Notice: Subject to any disclaimer, the term of this patent is extended or adjusted under 35 U.S.C. 154(b) by 0 days.

(21) Appl. No.: 10/933,912

(22) Filed: Sep. 1, 2004

(65) Prior Publication Data
US 2005/0212106 A1    Sep. 29, 2005

(30) Foreign Application Priority Data
Mar. 24, 2004    (KR)    ............... 10-2004-0020075

(51) Int. Cl.
*H01L 23/34*    (2006.01)
(52) U.S. Cl. ............... 257/724; 257/777; 257/686; 257/685; 438/108; 438/109; 361/760; 340/572.5
(58) Field of Classification Search ........ 257/E23.037, 257/E23.039, E23.04, E23.052, E23.169, 257/777, 686, 678, 774, 676, 787, 796, 685; 438/108, 109, FOR. 368, FOR. 426; 361/760; 340/572.5
See application file for complete search history.

(56) References Cited

U.S. PATENT DOCUMENTS

| | | | | |
|---|---|---|---|---|
| 5,682,062 A | * | 10/1997 | Gaul ................... | 257/686 |
| 6,198,168 B1 | * | 3/2001 | Geusic et al. ........... | 257/774 |
| 6,268,796 B1 | * | 7/2001 | Gnadinger et al. ...... | 340/572.5 |
| 6,306,975 B1 | * | 10/2001 | Zhao et al. ............. | 525/276 |
| 6,353,265 B1 | * | 3/2002 | Michii .................. | 257/777 |
| 6,376,909 B1 | * | 4/2002 | Forbes et al. .......... | 257/734 |
| 6,577,013 B1 | * | 6/2003 | Glenn et al. ........... | 257/777 |
| 6,734,556 B1 | * | 5/2004 | Shibata ................ | 257/737 |
| 6,756,681 B1 | * | 6/2004 | Hanawa ................ | 257/774 |
| 6,790,761 B1 | * | 9/2004 | Sakata ................. | 438/619 |
| 6,809,421 B1 | * | 10/2004 | Hayasaka et al. ...... | 257/777 |
| 6,931,259 B1 | * | 8/2005 | Simmons et al. ....... | 455/550.1 |

OTHER PUBLICATIONS

U.S. Appl. No. 10/932,409, filed Sep. 1, 2004, Integrated Circuit Module Package and Assembly Method Thereof, Youngwoo Kwon.

* cited by examiner

*Primary Examiner*—Kenneth Parker
*Assistant Examiner*—Chris C. Chu

(57) ABSTRACT

A low profile radio frequency (RF) module and package with efficient heat dissipation characteristics, and a method of assembly thereof, are provided. In some embodiments, the RF module package comprises a radio frequency integrated circuit (RFIC) attached to a recessed area of a lead frame. The RFIC has an active integrated circuit pattern and a plurality of conductors formed on input/output pads of the active integrated circuit pattern. An integrated passive device (IPD) is attached to the RFIC via the plurality of conductors. The IPD has a passive integrated circuit pattern, a plurality of electrode pads connected to nodes of the passive integrated circuit pattern, and metal-filled vias for electrically connecting the electrode pads to the plurality of conductors. The RFIC includes a plurality of heat conducting vias for conducting heat to the lead frame.

18 Claims, 6 Drawing Sheets

MULTILAYER INTEGRATED CIRCUIT FOR RF COMMUNICATION AND METHOD FOR ASSEMBLY THEREOF

CROSS-REFERENCE TO RELATED APPLICATIONS

This application claims priority from Korean Patent Application No. 2004-0020075 by Youngwoo Kwon, entitled "RF Module Package and Assembly Method Thereof," filed Mar. 24, 2004, the disclosure of which is incorporated by reference herein. This application is related to U.S. application Ser. No. 10/932,409 entitled "INTEGRATED CIRCUIT MODULE PACKAGE AND ASSEMBLY METHOD THEREOF" filed on even date herewith.

BACKGROUND OF THE INVENTION

1. Field of the Invention

This invention relates generally to radio frequency (RF) communication and more particularly to a multilayer integrated circuit for RF communication and methods for assembly thereof.

2. Description of the Background Art

Cell phone manufacturers are under competitive pressure to make cell phones smaller, less costly, more power efficient, and more sophisticated by adding new functional capabilities. Accordingly, designers may focus on reducing the size and cost of RF modules. An RF module of a typical handset includes the electronic circuitry for receiving, processing, and transmitting RF signals. Typically, the RF module consists of a radio frequency integrated circuit (RFIC) and passive electronic components. For example, the RFIC may include a voltage controlled oscillator, a low noise amplifier, a filter, a mixer, and an antenna. The passive electronic components include resistors, capacitors, and inductors.

In general, the passive components are not integrated with the RFIC, and consequently consume large areas of the RF module. For example, in a conventional RF module, a spiral inductor is a coil wound several times within a defined area on a single plane of the RF module. Since the spiral inductor has an inductance value proportional to various physical dimensions including the length of the coil and the number of windings, the inductor may consume a large percentage of costly RF module real estate.

FIG. 1 shows a conventional RF module 100 of the prior art. The conventional RF module 100 includes a plurality of RFICs 110, 120, and 130 mounted on a lead frame 105. The RFICs 110, 120, and 130 are electrically connected to a plurality of lead frame inductors 140, 150, and 160 through bonding wires 170. The lead frame inductors 140, 150, and 160 are formed of the same material as that of the lead frame 105 for impedance matching to the RFICs 110, 120, and 130. According to other embodiments of the prior art, the inductors 140, 150, and 160 may be configured on printed circuit boards (not shown), and electrically connected to the RFICs 110, 120, and 130 via the bonding wires 170. Size and configuration of the conventional RF module 100 is determined to a large extent by the modular space occupied by the lead frame inductors 140, 150, and 160. The constraint placed upon the size and configuration of the RF module 100 by the lead frame inductors 140, 150, and 160 is disadvantageous to design engineers for developing smaller, lower cost handsets with efficient heat dissipation properties.

FIG. 2 illustrates a cross sectional view of a plastic ball grid array (BGA) packaged RF module 200 of the prior art, such as RF module 100 shown in FIG. 1. As illustrated in FIG. 2, the RFIC 110 is mounted on the lead frame 105 of a package substrate 210. An electrode pad (not shown) of the RFIC 110 is electrically connected to the lead frame inductor 150 via the bonding wire 170. The lead frame inductor 150 is connected to a solder ball 230 through a via 220. The via 220 is formed by punching the package substrate 210 and filling the punched substrate 210 with metal. The plastic BGA packaged RF module 200 includes a mold cap 240 formed of a plastic material. As illustrated, it is apparent that elements of the plastic BGA packaged RF module 200 are spread over a large area, and that heat generated by the RFIC 110 is transported through the RFIC 110 to the lead frame 105 for dissipation. Since the mold cap 240 is not a good conductor of heat, the lead frame 105 acts as a single heat sink for the RFIC 110.

FIG. 3 illustrates a cross sectional view of a thermal enhanced BGA packaged RF module 300 of the prior art, such as RF module 100 shown in FIG. 1. The thermal enhanced BGA packaged RF module 300 is designed to provide a more efficient mechanism for heat dissipation. As illustrated in FIG. 3, the RFIC 110 is mounted on the lead frame 105, and the lead frame 105 is attached to a first surface 312 of a heat sink plate 310. Electrode pads (not shown) of the RFIC 110 are wire bonded to electrode terminals 315 of a multi-PCB layer 320, and connected to solder balls 340 through vias 330 filed with metal in the multi-layered PCB layer 320. A heat transfer gel 350 (also referred to as thermal grease) is deposited on a second surface 314 of the heat sink plate 310. Heat generated by the RFIC 110 is transported from the RFIC 110 to an upper surface 316 of the thermal enhanced BGA packaged RF module 300 via the lead frame 105, the heat sink plate 310, and the heat transfer gel 350. The heat is then dissipated by the upper surface 316.

However, manufacturing process steps in the assembly of the multi-PCB layer 320 are complex, and may lead to low yields. In addition, a multi-PCB layer designed RF module, such as the thermal enhanced BGA packaged RF module 300, is typically voluminous due to the thickness of the multi-PCB layer 320. Furthermore, heat flow is unidirectional, and thus restricted, due to layout and configuration of the RFIC 110, lead frame 105, heat sink plate 310, and thermal grease 350.

In addition to reducing size, another important concern of RF module design engineers is removal of heat generated by the RFIC 110. The RFIC 110 typically includes one or more power amplifiers that generate a large amount of heat that may change transistor parameters and affect RF signal processing operations. It is critical to the stable operation of the RFIC 110 that an RF module package effectively dissipate the heat generated during RF operation. In fact, if heat is not effectively dissipated, electronic components of the RFIC 110 may be damaged and rendered non-operational. Since the plastic BGA packaged RF module 200 (FIG. 2) and the thermal enhanced BGA packaged RF module 300 (FIG. 3) dissipate heat in one direction only, heat transfer rates are poor for these designs.

It is thus desirable to provide a low-profile RF module package having a high heat transfer rate.

SUMMARY OF THE INVENTION

The present invention provides a vertically integrated radio frequency module a vertically integrated radio frequency module package, and a method of assembling a vertically integrated radio frequency module package. The vertically integrated radio frequency module and package are advantageously configured to have low profiles and efficient heat dissipation characteristics. The vertically integrated radio frequency module comprises a radio frequency integrated circuit die and an integrated passive device die in a stacked arrangement such that the integrated passive device die is disposed above the radio frequency integrated circuit die. The radio frequency integrated circuit die includes, on an upper surface thereof, an active integrated circuit pattern having an input/output pad, and the vertically integrated radio frequency module further comprises a conductor disposed on the input/output pad. The integrated passive device die includes, on an upper surface thereof, a passive integrated circuit pattern having an electrode pad electrically connected to the conductor.

In some embodiments of the vertically integrated radio frequency module, the integrated passive device die further includes a via that can be filled with a metal. In some of these embodiments the via is connected to the conductor on the input/output pad of the active integrated circuit pattern. Also in some embodiments, the integrated passive device and the radio frequency integrated circuit dies have a same lateral dimension.

The vertically integrated radio frequency module package comprises a lead frame, a radio frequency integrated circuit die attached to the lead frame, and an integrated passive device die disposed above the radio frequency integrated circuit die. In these embodiments the radio frequency integrated circuit die includes, on an upper surface thereof, an active integrated circuit pattern having an input/output pad, and the package further includes a conductor disposed on the input/output pad. In these embodiments the integrated passive device die also includes, on an upper surface thereof, a passive integrated circuit pattern having an electrode pad electrically connected to the conductor.

In some embodiments of the package the lead frame includes a recessed area, and the radio frequency integrated circuit die can be attached to the lead frame within the recessed area. The lead frame can also include coupling fingers that, in some embodiments, are used as external pins. The package can further comprise a space between the radio frequency integrated circuit and integrated passive device dies. The space between the dies can be filled with an electrically insulating material. Similarly, the package can further comprise a protective material, such as a thermosetting material, covering the lead frame and the radio frequency integrated circuit and integrated passive device dies.

The method of assembling the vertically integrated radio frequency module package comprises preparing first and second wafers and simultaneously sawing the first and second wafers. Preparing the first wafer includes defining an active integrated circuit pattern, and preparing the second wafer including defining a passive integrated circuit pattern. Accordingly, simultaneously sawing the first and second wafers forms, from the first wafer, a radio frequency integrated circuit die having the active integrated circuit pattern on an upper surface thereof, and from the second wafer, an integrated passive device die having the passive integrated circuit pattern on an upper surface thereof. The method further comprises attaching the radio frequency integrated circuit die to a lead frame, and joining a bottom surface of the integrated passive device die to an upper surface of the radio frequency integrated circuit die.

In some embodiments, preparing the first wafer further includes thinning the first wafer, for instance, by back-grinding the first wafer. Preparing the first wafer can further include forming a via through the first wafer, such as by etching. Forming the via can also include metallizing the via. Additionally, preparing the first wafer can also include forming a conductor on an input/output pad of the active integrated circuit pattern. Likewise, preparing the second wafer can further include forming a via through the second wafer, which can include metallizing the via. In some of these embodiments joining the bottom surface of the integrated passive device die to the upper surface of the radio frequency integrated circuit die includes joining the conductor of the active integrated circuit pattern to the metallized via.

The method can further comprise preparing the lead frame before attaching the radio frequency integrated circuit die thereto. In some embodiments, preparing the lead frame includes forming a recessed area. In some of these embodiments attaching the radio frequency integrated circuit die to the lead frame includes attaching the radio frequency integrated circuit die within the recessed area. The method can also comprise disposing an electrically insulating material in a space between the dies, which can include under-filling the space. In some embodiments the electrically insulating material includes an epoxy. The method can also comprise forming an over-mold over the lead frame and the radio frequency integrated circuit and integrated passive device dies. In these embodiments forming the over-mold can include depositing and curing an epoxy.

DETAILED DESCRIPTION OF THE INVENTION

Figure 1:
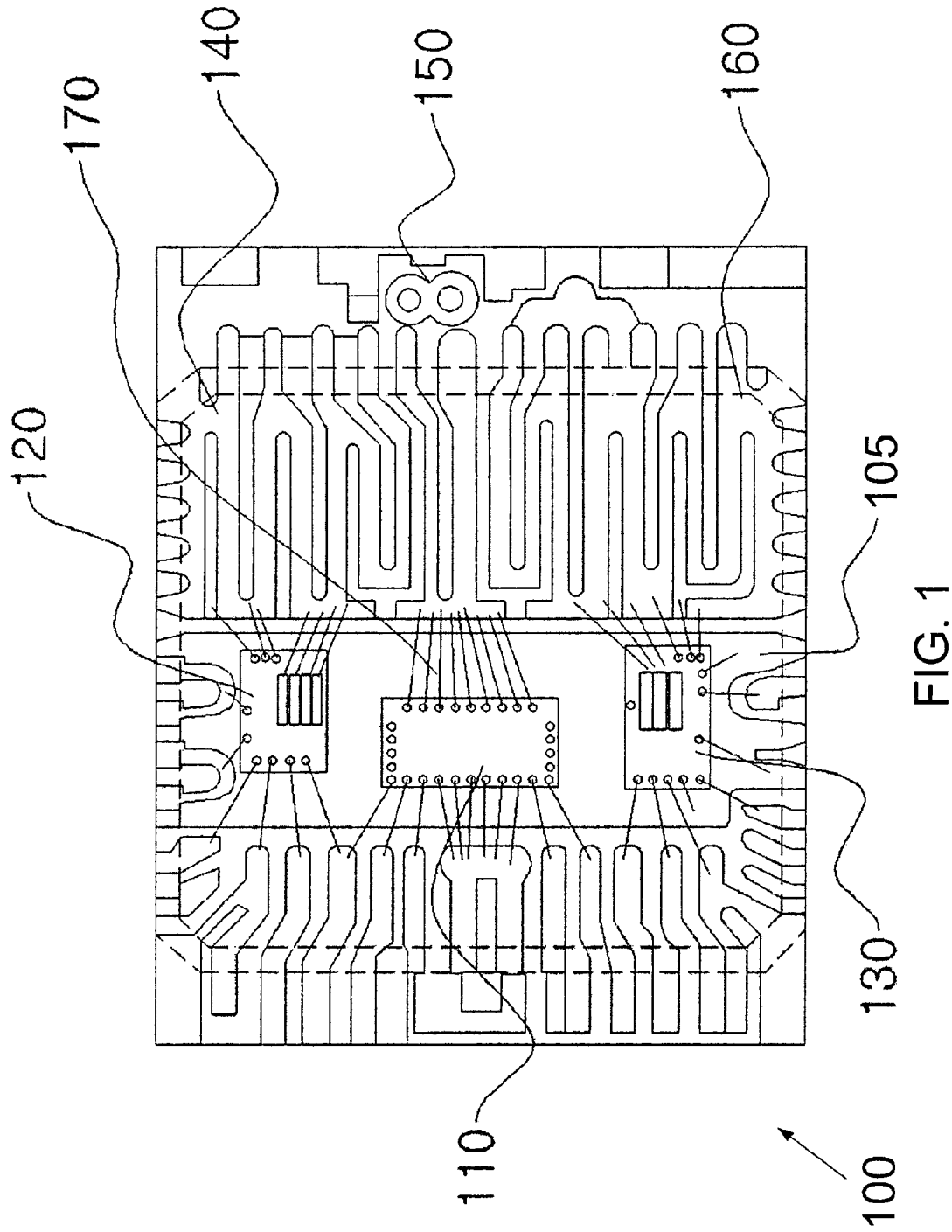
FIG. 1 shows a conventional RF module of the prior art.
Figure 2:
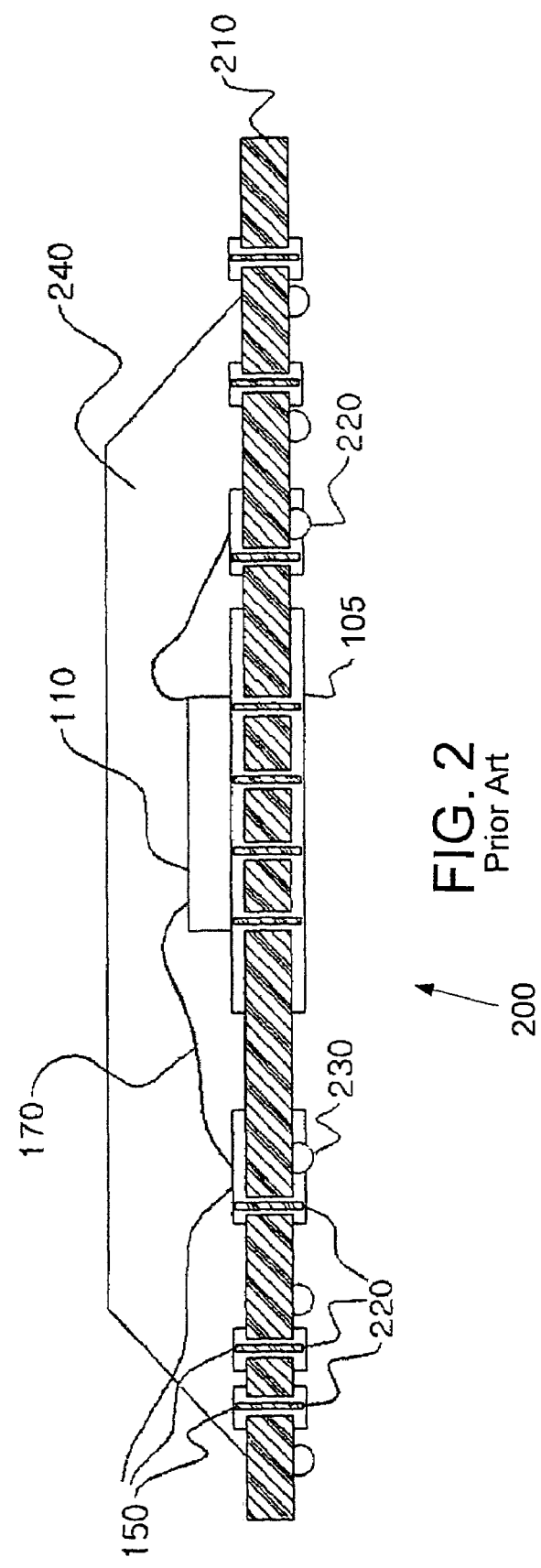
FIG. 2 illustrates a cross sectional view of a plastic BGA packaged RF module of the prior art.
Figure 3:
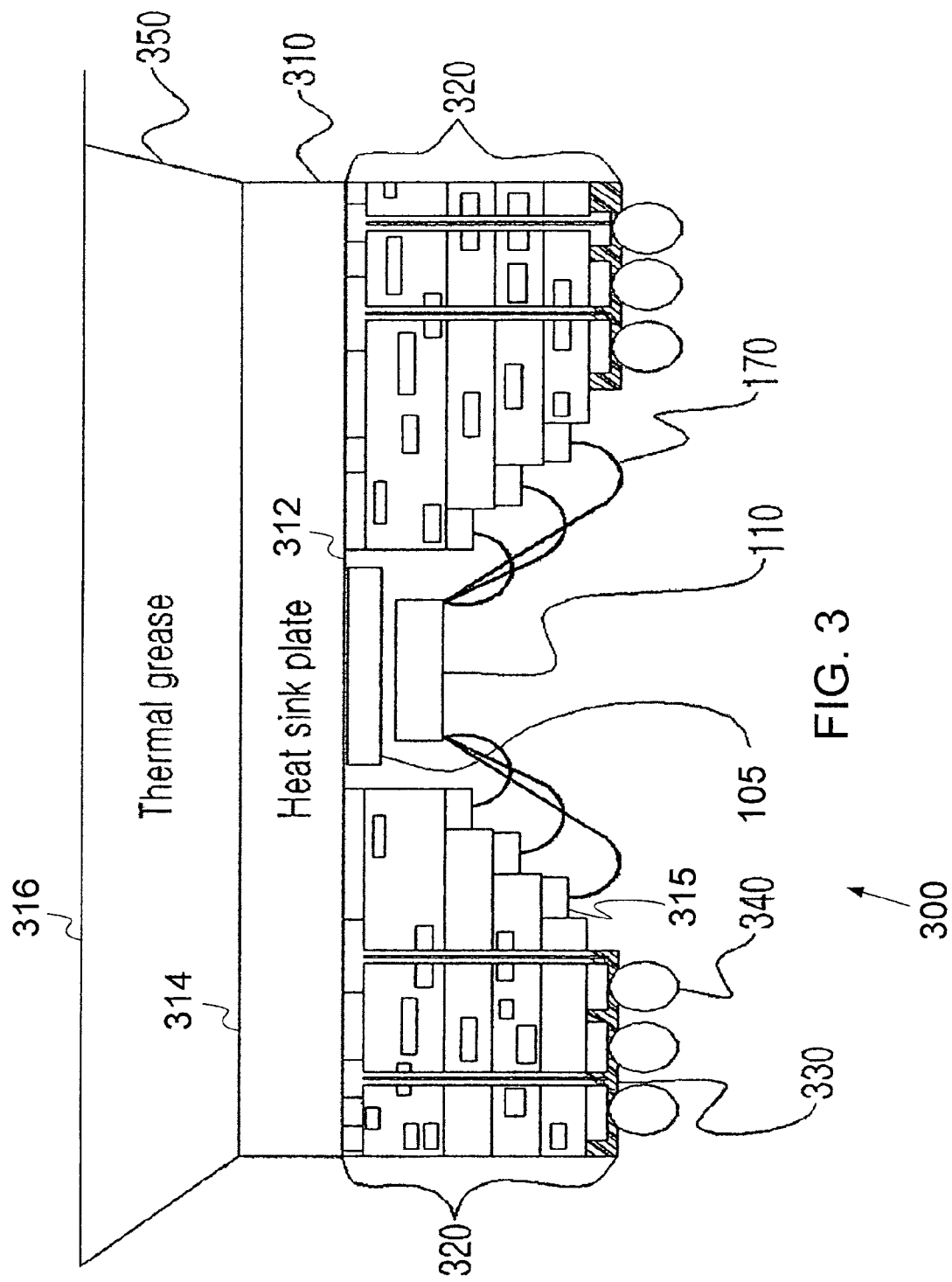
FIG. 3 illustrates a cross sectional view of a thermal enhanced BGA packaged RF module of the prior art.
Figure 4:
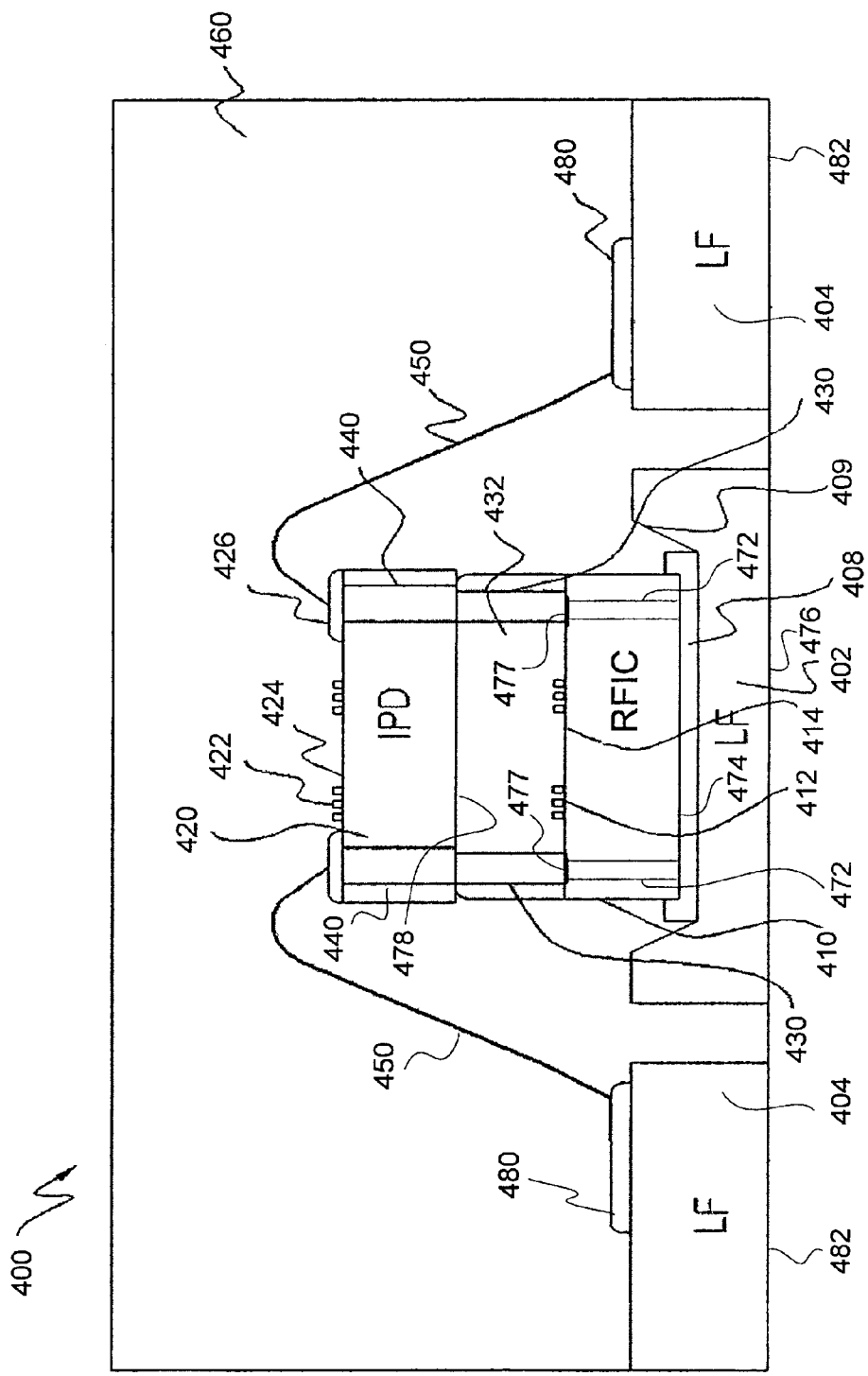
FIG. 4 illustrates a vertically integrated RF module package, according to one embodiment of the present invention.

FIG. 4 illustrates a vertically integrated RF module package 400 according to one embodiment of the present invention. The vertically integrated RF module package 400 comprises an RFIC 410 and an integrated passive device (IPD) 420 stacked on a lead frame 402. The RFIC 410 and the IPD 420 may also be referred to as an RFIC die and an IPD die, respectively. In one embodiment of the present invention, the RFIC 410 is fabricated on a gallium arsenide (GaAs) substrate and the IPD 420 is fabricated on a silicon (Si) substrate. On an upper surface 414 of the RFIC 410, an active integrated circuit pattern 412 is formed. The active integrated circuit pattern 412 comprises active radio frequency circuitry for processing RF signals. The active radio frequency circuitry may include any number or combination of, transistors, power amplifiers, synthesizers, A/D converters, and D/A converters, for example. Similarly, on an upper surface 424 of the IPD 420, a passive integrated circuit pattern 422 is formed. The passive integrated circuit pattern 422 defines passive radio frequency circuitry for processing RF signals. The passive radio frequency circuitry includes capacitors, resistors, and inductors, for example.

Since gallium arsenide is a poor thermal conductor and is more expensive than silicon, a lateral size of the RFIC 410 is minimized, in accordance with the present invention. Reducing the lateral size of the RFIC 410 both reduces the cost of the vertically integrated RF module package 400, and also improves heat dissipation characteristics of the RFIC 410. For example, as the lateral size of the RFIC 410 decreases, the surface to volume ratio of the RFIC 410 increases, thus providing more surface area per unit volume for heat dissipation. In order to minimize the lateral size of the RFIC 410, passive components, such as resistors, capacitors, and inductors, are fabricated as parts of the passive integrated circuit pattern 422 of the IPD 420. To further reduce the lateral size of the vertically integrated RF module package 400, the IPD 420 is stacked on top of the RFIC 410.

The active integrated circuit pattern 412 of the RFIC 410 comprises active RF elements, such as transistors and power amplifiers, for example, that typically generate large quantities of heat. To further expedite heat transfer and dissipation, the RFIC 410 is configured with heat conducting vias 472 to transfer heat to the lead frame 402. The heat conducting vias 472 have a two-prong effect. First, the heat conducting vias 472 increase the surface to volume ratio of the RFIC 410 to provide a higher rate of heat dissipation. Second, the heat conducting vias 472 provide heat conducting paths through the RFIC 410 for transferring heat generated by the active integrated circuit pattern 412 of the RFIC 410 to the lead frame 402. The lead frame 402 is a good conductor of heat. In one embodiment of the invention, the lead frame is composed of aluminum.

As illustrated in the FIG. 4 embodiment of the invention, the RFIC 410 and the IPD 420 are configured to have identical lateral sizes. Thus, batch processes for manufacturing identically sized silicon IPD dies and gallium arsenide RFIC dies from silicon and gallium arsenide wafers may be advantageously used. For example, alignment and sawing process steps may be simultaneously carried out with respect to RFIC wafers (i.e., gallium arsenide wafers with active integrated circuit patterns) and IPD wafers (i.e., silicon wafers with passive integrated circuit patterns). Accordingly, the number of semiconductor manufacturing process steps can be reduced.

As illustrated in FIG. 4, the lead frame 402 preferably includes a recessed area 409 configured to receive the stacked configuration of the RFIC 410 and the IPD 420. The recessed area 409 can be formed, for example, by etching a portion of the lead frame 402 in order to make that portion thinner than the remainder of the lead frame 402. A back surface 474 of the RFIC 410 is attached to the recessed area 409 of the lead frame 402, for instance, by a solder paste 408. Attaching the RFIC 410 within the recessed area 409 provides for a lower-profile vertically integrated RF module package 400. In addition, since heat is dissipated from a lower surface 476 of the lead frame 402 via contact with either an air boundary or a heat sink (not shown) and because the lead frame 402 is thinner beneath the recessed area 409, a higher temperature gradient exists across the lead frame 402 directly below the recessed area 409 than elsewhere. The higher temperature gradient provides a higher rate of heat flow from the RFIC 410 to the lower surface 476 of the lead frame 402.

Input/output pads 477 of the active integrated circuit pattern 412 of the RFIC 410 are electrically connected to electrode pads 426 through conductors 430 and metal-filled vias 440. The electrode pads 426 are electrically connected to nodes (not shown) of the passive integrated circuit pattern 422 of the IPD 420. Accordingly, the input/output pads 477 of the active integrated circuit pattern 412 are electrically connected to nodes of the passive integrated circuit pattern 422 through the electrode pads 426, the metal-filled vias 440, and the conductors 430. In one embodiment of the present invention, the metal-filled vias 440 are formed by etching the silicon IPD 420 to form vias. The vias are then filled with a metal such as gold (Au), nickel (Ni), palladium (Pd), copper (Cu), or an alloy thereof, to form the metal-filled vias 440. In accordance with the present invention, the conductors 430 are formed of gold (Au) or a gold alloy. The conductors 430 not only provide an electrically connection between certain passive and active circuit elements of the passive integrated circuit pattern 422 and the active integrated circuit pattern 412, respectively, but also provide a means of mounting the IPD 420 to the RFIC 410 to form a vertical die stack. As illustrated, a lower surface 478 of the IPD 420 is disposed above the RFIC 410 and attached to the conductors 430.

In accordance with an embodiment of the invention, a first filling space 432 enclosed between the RFIC 410 and the IPD 420 is under-filled with an electrically insulating material such as a plastic material or an adhesive having a low elasticity by utilizing syringe cleaning, sheet lamination, or screen printing. The electrode pads 426 of the IPD 420 are wire bonded to lead frame coupling fingers 404 via wire bonds 450 and lead frame coupling finger pads 480. In one embodiment of the present invention, the lead frame coupling fingers 404 are used as external pins of the RF module package 400. In another embodiment of the present invention in which the RF module package 400 is mounted on a plastic substrate (not shown) as a plastic BGA packaging module, lower surfaces 482 of the lead frame coupling fingers 404 are connected to solder balls (not shown). The solder balls are used as external pins of the RF packaging module 400.

A second filling space 460 of the RF module package 400 is filled, for example, with a general epoxy based thermosetting material. The general epoxy based thermosetting material electrically isolates and physically protects the RF module package 400. In addition, manufacturers typically use the general epoxy based thermosetting material as a recordable substrate to inscribe part numbers, lot numbers, manufacturing dates, or other data associated with module performance or module operating parameters, for example.

According to the present invention, the vertically integrated RF module package 400 as illustrated and described herein is configured to efficiently dissipate heat by transferring heat generated by the active integrated circuit pattern 412 of the RFIC 410 to the lead frame 402 via the heat conducting vias 472 and to the IPD 420 via the conductors 430. Furthermore, vertically stacking and attaching the RFIC 410 and the IPD 420 to the recessed area 409 of the lead frame 402 reduces vertical thickness of the RF module package 400, leading to low-profile, less costly handsets with better heat dissipation characteristics and shorter wire bonds. Wire bonds of reduced length, such as the wire bonds 450, contribute less parasitic resistance and inductance, and may lead to higher manufacturing yields of RF module packages 400. In addition, since the active integrated circuit pattern 412 of the RFIC 410 and the passive integrated circuit pattern 422 of the IPD 420 do not face each other (as in a flip-chip configuration), electrical noise due to crosstalk is reduced or eliminated.

Figure 5:
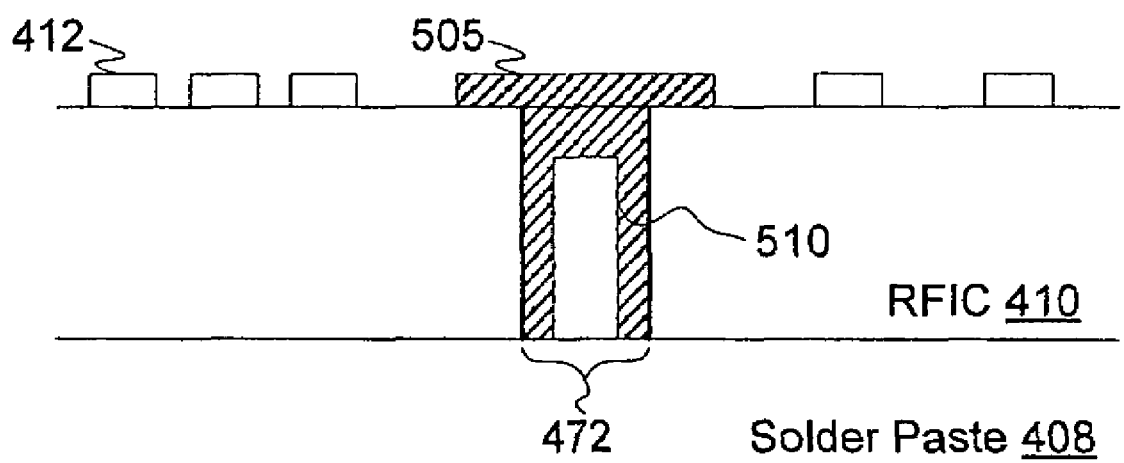
FIG. 5, illustrates the heat conducting via shown in FIG. 4, according to one embodiment of the present invention.

FIG. 5 illustrates the heat conducting via 472 shown in FIG. 4, according to one embodiment of the present invention. The heat conducting via 472 comprises a metal plug 505 and an air space 510. In manufacture, the RFIC 410 is drilled (i.e., etched) to form the heat conducting via 472. Next, the heat conducting via 472 undergoes metallization and the metal plug 505 is formed. Although FIG. 5 shows the air space 510 as a well defined, symmetrical, rectangular volume, the air space 510 may have any shape and occupy any percentage of volume of the heat conducting via 472, based in part upon the metallization procedure. When the RF module package 400 (FIG. 4) is processing RF signals, heat generated by the active integrated circuit pattern 412 flows into the lead frame 402 via the metal plug 505 and the solder paste 408. Although the RFIC 410 is a poor conductor of heat, the metal plug 505, the solder paste 408, and the lead frame 402 are good heat conductors, and provide effective heat conduits.

Figure 6:
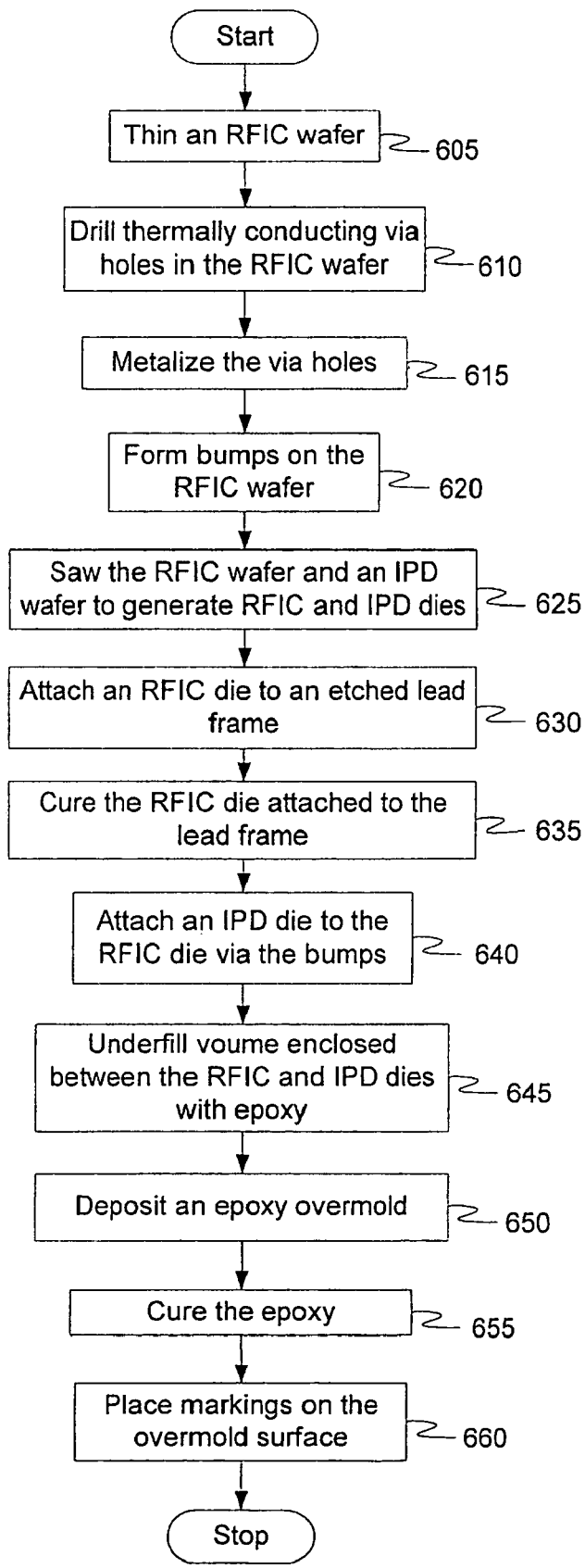
FIG. 6 is an exemplary flowchart of process steps for assembly of the RFIC module package shown in FIG. 4, according to one embodiment of the present invention.

FIG. 6 is a flowchart of exemplary process steps for assembling the RFIC module package 400 shown in FIG. 4, according to one embodiment of the present invention. In step 605, an RFIC wafer (i.e., a wafer onto which an RFIC is integrated) is thinned. Thinning the RFIC wafer prepares the wafer for subsequent etching processes. Thinning the RFIC wafer may be accomplished by back-grinding the wafer. For example, a 500 micron RFIC wafer may be thinned to form a 100 micron RFIC wafer. In one embodiment of the invention, the RFIC wafer is a gallium arsenide wafer.

Next, in step 610, heat conducting vias 472 (FIG. 4) are drilled through the RFIC wafer to provide channels for heat flow and dissipation. In one embodiment of the process, the heat conducting vias 472 are etched in the RFIC wafer. In step 615, the heat conducting vias 472 are metallized to provide high heat conducting paths from the active integrated circuit pattern 412 (FIG. 4) located on an upper surface of the RFIC wafer to a heat sink attached to a lower surface of the RFIC wafer. In one embodiment of the invention, a lead frame 402 (FIG. 4) is utilized as the heat sink.

In step 620, conductors 430 (FIG. 4) are formed on the RFIC wafer. In one embodiment of the invention, the conductors 430 are electrically connected to the input/output pads 477 (FIG. 4) of the active integrated circuit pattern 412 (FIG. 4). The conductors 430 may be stud bumps, solder bumps, or electroless bumps, and formed of a conductive material such as gold (Au) or a gold alloy.

In step 625, the RFIC wafers and silicon IPD wafers are sawed to produce RFIC and IPD dies. Since the silicon IPD dies and gallium arsenide RFIC dies are of the same lateral size, batch processes for manufacturing the IPD and RFIC dies from the silicon and gallium arsenide wafers may be advantageously used. For example, alignment and sawing process steps may be simultaneously carried out with respect to both the RFIC wafers and the IPD wafers. Accordingly, the number of manufacturing process steps can be reduced.

In step 630, the RFIC die 410 (FIG. 4) is attached to a recessed area 409 (FIG. 4) of a lead frame 402 (FIG. 4) using solder paste 408 (FIG. 4). According to the invention, the recessed area 409 of the lead frame 402 is approximately the same lateral size of the RFIC die 410, and is configured to receive the RFIC die 410. Next, in step 635, the RFIC die 410 with the lead frame 402 attached is thermally treated to cure the solder paste 408 and the material of the conductors 430 by removing organic materials contained therein.

In step 640, the IPD die 420 (FIG. 4) is mounted to the RFIC die 410 via the conductors 430. The IPD die 420 comprises a passive integrated circuit pattern 422 (FIG. 4), electrode pads 426 (FIG. 4) electrically connected to nodes of the passive integrated circuit pattern 422 and wire bonded to the lead frame coupling fingers 404 (FIG. 4), and metal-filled vias 440 (FIG. 4) electrically coupled to the electrode pads 426. Once the IPD die 420 is mounted to the RFIC die 410 via the conductors 430, nodes of the passive integrated circuit pattern 422 are electrically connected to elements of the active integrated circuit pattern 412 via the electrode pads 426, the metal-filled vias 440, the conductors 430, and the input/output pads 477.

In step 645, a first filling space 432 (FIG. 4) enclosed between the RFIC die 410 and the IPD die 420 is under-filled with an epoxy. In one embodiment, a syringe may be used to inject a low dielectric constant epoxy into the first filling space 432. The epoxy electrically isolates and mechanically stabilizes the IPD die 420 and the RFIC die 410.

Next, in step 650, a second filling space 460 (FIG. 4) is over-filled with an epoxy (i.e., an epoxy over-mold is deposited). In step 655, the epoxy is thermally cured to change from a liquid state to a solid state. Finally, in step 660, markings are optionally placed on the epoxy over-mold surface of the RF module package 400, completing the assembly process.

The present invention has been described above with reference to exemplary embodiments. Other embodiments will be apparent to those skilled in the art in light of this disclosure. The present invention may readily be implemented using configurations other than those described in the exemplary embodiments above. Therefore, these and other variations upon the exemplary embodiments are covered by the present invention.

What is claimed is:

1. A vertically integrated radio frequency module, comprising:
    a radio frequency integrated circuit die including, on an upper surface thereof, active integrated circuits having an input/output pad, the radio frequency integrated circuit die further comprising a heat conducting via that thermally couples the active integrated circuits to a lead frame;
    a conductor disposed within a first filling space adjacent to the upper surface of the radio frequency integrated circuit die, the conductor coupled to the input/output pad; and
    an integrated passive device die disposed above the radio frequency integrated circuit die and the first filling space, the integrated passive device die including, on an upper surface thereof, a passive integrated circuit pattern having an electrode pad electrically connected to the conductor, wherein the passive integrated circuit pattern is coupled to the active integrated circuits, and the lead frame by a via through the integrated passive device die, the conductor and the heat conducting via.

2. The radio frequency module of claim 1 wherein the conductor is a stud bump.

3. The radio frequency module of claim 1 wherein the conductor is a solder bump.

4. The radio frequency module of claim 1 wherein the conductor is an electroless bump.

5. The radio frequency module of claim 1 wherein the integrated passive device and the radio frequency integrated circuit dies have a same lateral dimension.

6. The radio frequency module of claim 1 wherein the heatconducting via comprises a metallization layer.

7. The radio frequency module of claim 6 wherein the heat conducting via includes a metal plug on the upper surface of the radio frequency integrated die.

8. The radio frequency module of claim 7 wherein the heat conducting via includes an air space.

9. The radio frequency module of claim 1 wherein the radio frequency integrated circuit die includes gallium arsenide and the integrated passive device die includes silicon.

10. A vertically integrated radio frequency module package, comprising:
   a lead frame;
   a radio frequency integrated circuit die attached to the lead frame and including, on an upper surface thereof, active integrated circuits having an input/output pad, the radio frequency integrated circuit die further comprising a heat conducting via that thermally couples the active integrated circuits to the lead frame;
   a conductor disposed within a first filling space adjacent to the upper surface of the radio frequency integrated circuit die, the conductor coupled to the input/output pad; and
   an integrated passive device die disposed above the radio frequency integrated circuit die and the first filling space, the integrated passive device die including, on an upper surface thereof, a passive integrated circuit pattern having an electrode pad electrically connected to the conductor, wherein the passive integrated circuit pattern is coupled to the active integrated circuits, and the lead frame by a via through the integrated passive device die, the conductor and the heat conducting via.

11. The radio frequency module package of claim 10 wherein the lead frame includes a recessed area.

12. The radio frequency module package of claim 11 wherein the radio frequency integrated circuit die is attached to the lead frame within the recessed area.

13. The radio frequency module package of claim 10 wherein the radio frequency integrated circuit die is attached to the lead frame with a solder paste.

14. The radio frequency module package of claim 10 wherein the space is filled with an electrically insulating material.

15. The radio frequency module package of claim 10 further comprising a protective material covering the lead frame and the radio frequency integrated circuit and integrated passive device dies.

16. The radio frequency module package of claim 15 wherein the protective material includes a thermosetting material.

17. The radio frequency module package of claim 10 wherein the lead frame includes coupling fingers.

18. The radio frequency module package of claim 17 wherein the coupling fingers are used as external pins.

* * * * *